United States Patent [19]

Yoon et al.

[11] Patent Number: 5,075,248

[45] Date of Patent: Dec. 24, 1991

[54] METHOD OF MAKING DRAM HAVING A SIDE WALL DOPED TRENCH AND STACKED CAPACITOR STRUCTURE

[75] Inventors: Han S. Yoon, Kyungki; Jae C. Om, Taegu; Jae W. Kim, Seoul; In S. Chung, Kyungki; Jin H. Kim, Chung, all of Rep. of Korea

[73] Assignee: Hyundai Electronics Industries Co., Ltd., Rep. of Korea

[21] Appl. No.: 660,151

[22] Filed: Feb. 20, 1991

Related U.S. Application Data

[62] Division of Ser. No. 408,135, Sep. 15, 1989, abandoned.

[30] Foreign Application Priority Data

Sep. 22, 1988 [KR] Rep. of Korea ................ 12242/88

[51] Int. Cl.⁵ .......................................... H01L 21/70
[52] U.S. Cl. ........................................ 437/52; 437/38;
437/47; 437/48; 437/60; 437/193; 437/162;
437/233; 437/919
[58] Field of Search ................. 357/23.6, 55; 437/38,
437/47, 48, 51, 52, 60, 162, 193, 195, 203, 228,
233, 235, 919

[56] References Cited

U.S. PATENT DOCUMENTS

| | | | |
|---|---|---|---|
| 4,366,613 | 1/1983 | Ogura et al. | 437/48 |
| 4,433,468 | 2/1984 | Kawamata | 437/193 |
| 4,688,063 | 8/1987 | Lu et al. | 357/55 |
| 4,728,623 | 3/1988 | Lu et al. | 357/23.6 |
| 4,786,954 | 11/1988 | Morie et al. | 357/45 |
| 4,801,988 | 1/1989 | Kenney | 357/23.6 |
| 4,873,205 | 10/1989 | Critchlow et al. | 437/200 |
| 4,894,696 | 1/1990 | Takeda et al. | 357/23.6 |
| 4,922,313 | 5/1990 | Tsuchiya | 357/55 |
| 4,967,248 | 10/1990 | Shimizu | 357/55 |

FOREIGN PATENT DOCUMENTS

| | | | |
|---|---|---|---|
| 0155699 | 9/1985 | European Pat. Off. | |
| 61-84053 | 4/1986 | Japan | 357/23.6 |
| 63-209159 | 8/1988 | Japan | 357/23.6 |

Primary Examiner—Brian E. Hearn
Assistant Examiner—Tom Thomas
Attorney, Agent, or Firm—Ladas & Parry

[57] ABSTRACT

A DRAM cell having a SDTAS structure having a trench stacked capacitor which includes a capacitor charge storage electrode which is in physical contact and is electrically connected to a N+ drain region, and a VCC/2 electrode which is electrically isolated by an ONO layer formed between the capacitor charge storage electrode and the VCC/2 electrode is disclosed. Such cell can increase the capacitance of the capacitor and reduce the area of the cell by reducing the width of the MOSFET, and a method for manufacturing such cell.

6 Claims, 3 Drawing Sheets

METHOD OF MAKING DRAM HAVING A SIDE WALL DOPED TRENCH AND STACKED CAPACITOR STRUCTURE

This application is a division of application Ser. No. 07/408,135, filed Sept. 15, 1989, now abandoned.

BACKGROUND OF THE INVENTION

1. Field of Invention

This invention relates to a DRAM (Dynamic Random Access Memory) cell of highly integrated semiconductor storage device, and a method for manufacturing the same, and more particularly to a DRAM cell having a SDTAS (Side-Wall Doped Trench and Stacked Capacitor) structure which can increase the capacitance of capacitor and reduce the area of cell by reducing the width of MOSFET, and a method for manufacturing such cell.

2. Related Application

A method for forming a selectively doped diffusion region using a photoresist etch back technology is fully described in U.S. Ser. No. 07/381,288, entitled: A Method For Manufacturing A Trench Capacitor Using A Photoresist Etch Back Process and a self-aligned contact process is fully described in U.S. Ser. No. 07/381,289, entitled: Dynamic Random Access Memory Cell and Method, both applications filed on Jul. 18, 1989, said applications being expressly incorporated herein by reference as if fully set forth hereat.

INFORMATION DISCLOSURE STATEMENT

In the prior art, since there is only one oxide film layer in the trench capacitor of the DRAM cell having a SDT (Side-Wall Doped Trench) structure, the capacitance of the trench capacitor is limited.

Also, since the process for forming the source and N+ drain regions of the MOSFET, and the process for connecting the bit line and the source region utilize the self-align contact mask, there is a problem that minimum tolerances should be maintained between the mask layers when the process tolerances occurring during the formation of mask layer for preventing the leak current between the transfer gate and the contact mask, and the tolerance for mask layer alignment process are considered.

There is another problem in that since a separate contact mask for connecting the N+ drain region and the charge storage electrode is utilized, the area of the cell increases.

Therefore, it is an object of present invention to provide a DRAM cell comprising a SDTAS structure in which the capacitance of capacitor can be maximized at the given area by forming stacked oxide layers in the trench and connecting the trench capacitor to the N+ drain region in parallel.

It is further object of present invention to provide an economical method of manufacturing a DRAM cell comprising a SDTAS structure.

It is further object of present invention to provide a DRAM cell comprising a SDTAS structure in which the area of MOSFET is reduced by connecting the N+ source region to the third poly layer with the self-alignment contact process, and by connecting the N+ drain region to the capacitor charge storage electrode is achieved in the silicon substrate, and a method for manufacturing such DRAM cell.

BRIEF SUMMARY OF THE INVENTION

This invention relates to a DRAM cell having a SDTAS structure and a method of manufacturing such cell. For summarizing the invention, the DRAM cell comprises a P type silicon substrate on which a P well region is formed with a trench formed through the P well region and extending into the P type silicon substrate. The trench further includes a wall having an inner surface and a outer surface. A capacitive oxide film layer is formed on the inner surface of wall of the trench, except for a top portion of the inner surface of wall of the trench since the N+ drain region is positioned there. An insulating oxide film layer for element separation is formed on the P well region opposite to the top portion of the inner surface of wall of the trench. A trench stacked capacitor which includes: 1. a capacitor charge storage electrode which is in physical contact and is electrically connected to the N+ drain region, and 2. a VCC/2 electrode which is electrically isolated by an ONO layer formed between the capacitor charge storage electrode and the VCC/2 electrode is formed. A selectively doped P+ diffusion region is formed from the outer surface of the wall of the trench in a portion of the P well region and a portion of the P type silicon substrate. A first LTO (Low Temperature Oxide) film layer is formed on the VCC/2 electrode. A gate electrode line is formed on the first LTO layer. A N MOSFET is formed on the P well region proximate the trench with the N MOSFET having a gate electrode, a N+ drain region and a N+ source region, with the N+ source region and the N+ drain region each including a LDD region. Oxide film spacers are formed at each side of the gate electrode and the gate electrode line. A second LTO layer is formed on the gate electrode and the gate electrode line. An IPOLY layer is formed from the top of the N+ source region to a portion of the top of the second LTO layer formed on the gate electrode. A third LTO layer is deposited on the entire surface except for a portion of the IPOLY layer formed on the N+ source region. A third poly layer for a bit line is formed on the third LTO layer and connected to the IPOLY layer formed on the N+ source region. A doped oxide film layer is formed on the third poly layer for a bit line. Metal layers are formed on a portion of the doped oxide film layer. A protective layer is formed on the entire surface.

The present invention further includes a method for manufacturing a DRAM cell having a SDTAS structure. For summarizing the invention, the method of manufacturing the DRAM cell comprises providing a P type silicon substrate and forming a P well region on the P type silicon substrate, the P well region including a top. An insulating oxide film layer for element separation is formed on a portion of the top of the P well region by the LOCOS process to position the insulating oxide film layer at a predetermined location on the P well region. A trench which extends through a portion of the insulating oxide film layer formed on the top of the P well region and into a portion of the P type silicon substrate is formed by the RIE etch process. The trench further includes a wall with an inner surface and an outer surface. A selectively doped P+ diffusion region which extends from the outer surface of the wall of the trench into a portion of the P well region and into a portion of the P type silicon substrate is formed by the photoresist etch back process. A capacitive oxide film layer is then formed on the edge of the insulating oxide film layer which was exposed by the formation of the trench and also on the P well region and on the inner surface of the wall of the trench. A N type polysilicon layer is deposited on the capacitive oxide film layer positioned in the trench and an area which is opposite to the insulating oxide film layer. The N type polysilicon layer is then removed from the area opposite to the insulating oxide film layer. The capacitive oxide film layer is removed from the area opposite to the insulating oxide film layer thereby exposing the P well region at this area opposite to the insulating oxide film layer. A first poly layer is deposited on the N type polysilicon layer, on the P well region opposite to the insulating oxide film layer and on the capacitive oxide film layer. The impurity contained in the first poly layer is then diffused into the P well region opposite to the insulating oxide film layer by heat treatment to form a N+ drain region. In the trench, a trench stacked capacitor is formed which comprises a capacitor charge storage electrode which is in physical contact and is electrically connected to the N+ drain region, and a VCC/2 electrode which is electrically isolated by an ONO layer formed between the capacitor charge storage electrode and the VCC/2 electrode. A first LTO oxide film layer is then deposited on the VCC/2 electrode and the ONO layer formed on the capacitive oxide film layer, on the drain region and on the top 22A of capacitor charge storage electrode, is removed. The capacitive oxide film layer formed on the top of P well region opposite to the insulating oxide film layer is removed. A gate electrode is formed on the P well region opposite to the insulating oxide film layer with a second LTO film layer being formed on the gate electrode. A gate electrode line is formed on the LTO film layer on the trench with the second LTO film layer being formed on the gate electrode. LDD regions are formed in the P well region adjacent to each side of the gate electrode by ion implantation. Oxide spacers are formed at each side of the gate electrode and the gate electrode line. An IPOLY layer is formed on the N+ source region, to be formed later, and on a portion of the gate electrode on which the second LTO film layer is formed. The N+ source region is formed by diffusing an impurity contained in the IPOLY layer into the P well region by the heat treatment. A portion of a third LTO film layer is removed from the IPOLY on the N+ source region after the third LTO film layer is formed on the entire surface. A third poly layer for a bit line is deposited on the third LTO film layer and the IPOLY layer where a portion of the third LTO film layer is removed, thereby connecting the N+ source region for bit line to the third poly layer. A doped oxide film layer is then formed on the third poly layer and a metal layer is formed on the doped oxide film layer. A protective layer is then formed on the doped layer and the metal layer.

Preferably, the N+ drain region is formed by depositing a N type polysilicon layer on the capacitive oxide film layer and depositing a layer of first photoresist over the N type polysilicon layer, to fill the trench with the first photoresist. The first photoresist and N type polysilicon layer are then removed by, for example, the etch back process from capacitive oxide film layer to a point "D" located in trench, thereby maintaining a portion of N type polysilicon layer and the first photoresist in the trench. The photoresist etch back process to point "D" exposes the P well region to provide electrical contact between the N+ drain region and the capacitor charge storage electrode which will be formed later. A second photoresist is deposited over the capacitive oxide film layer, the insulating oxide film layer and the trench. A portion of second photoresist is etched to thereby form a mask pattern which enables the etching of the capacitive oxide film layer which underlies second photoresist to expose the P well region opposite to the insulating oxide film layer. The first photoresist and the second photoresist are then both removed. A first poly layer is then deposited on the surface of the insulating oxide film layer, on the capacitive oxide film layer 13 and on the P well region. A N+ drain region is formed opposite to the insulating oxide film layer by diffusing an impurity contained in a first poly layer into the P well region by heat treatment.

Preferably, the trench stacked capacitor is formed by maintaining the first poly layer deposited in the trench while removing any other first poly layer deposited elsewhere, thereby forming a capacitor charge storage electrode which is in physical contact and is electrically connected to the N+ drain region. An ONO layer is then formed on the insulating oxide film layer, on the first poly layer, on the capacitive oxide film layer and on the P well region. A first N type poly material is deposited on the ONO layer formed on the P well region, and on the N+ drain region while simultaneously filling the trench with a first N type poly material. The first N+ type poly material is etched back in order to expose the ONO layer formed on the N+ drain region, the top of the N type first poly layer and on the P well region opposite to the insulating oxide film layer, and the depositing a second poly material on the first poly layer which fills the trench, and on the ONO layer formed on the insulating oxide film layer, thereby forming the VCC/2 electrode.

Preferably, the P+ diffusion region is formed by the photoresist etch back process which comprises the steps of:

Depositing an impurity dopant source on the inner surface of wall of the trench wall, Filling the trench with a photoresist, and selectively etching back the photoresist to the desired etch back end point, Removing the portion of the impurity dopant exposed by the selective etching of the photoresist, and removing all the remaining photoresist, Forming the selective P+ region on the outer surface of wall of the trench by the heat treatment of remaining impurity dopant source; and Removing the remaining impurity dopant source from the trench.

Preferably, the method for manufacturing a DRAM cell having a SDTAS according to the present invention includes forming the N+ source region and forming the third poly layer for the bit line connected to the N+ source region through the IPOLY layer are performed by the self-aligned contact process.

The novel feature of the present may be understood from the accompanying description when taken in conjunction with the accompanying drawings.

DETAILED DESCRIPTION

Figure 1:
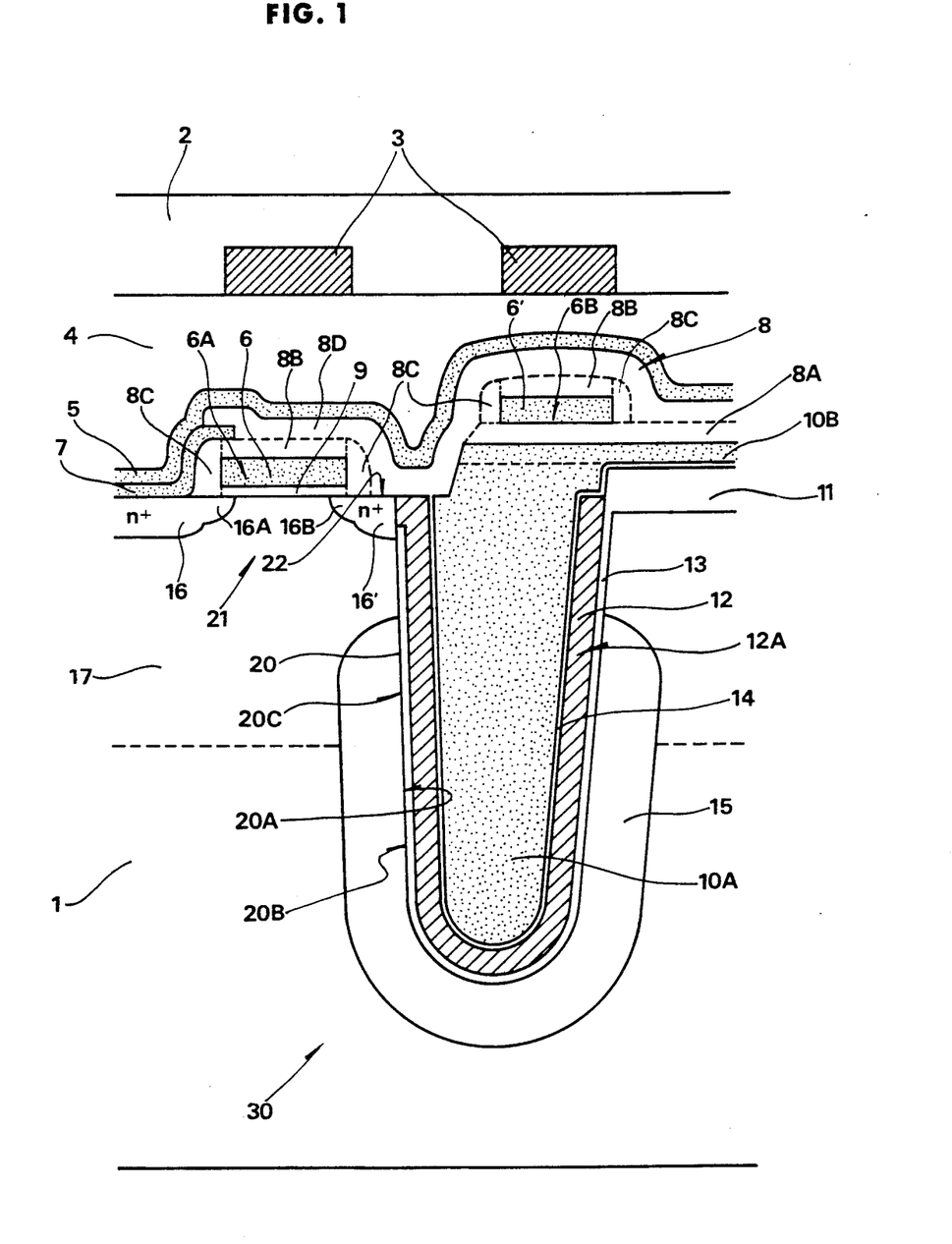
FIG. 1 illustrates a cross-section of a DRAM cell comprising a SDTAS structure according to the present invention.

FIG. 1 illustrates a cross-section of a DRAM cell having a SDTAS structure according to the present invention.

Briefly, it is a DRAM cell in which after a P well region 17 is formed in a P type silicon substrate 1, a N type MOSFET 21 and a trench stacked capacitor 30 having a P+ diffusion region 15 formed on a portion of the outer surface 20B of wall 20C of the trench 20 are connected.

A source region 16 and a drain region 16' of the MOSFET 21 are formed in the P well region 17. A second poly layer 6 used for a gate electrode 6A is formed on a gate oxide film 9 which is formed on the P well region 17 and a second poly layer 6' is used for a gate electrode line 6B is formed on a first LTO film layer 8A which is formed on the trench stacked capacitor 30, respectively. A third poly layer 5 is connected to a N+ source region 16 through a IPOLY (Interconnection POLY) layer 7 formed on the N+ source region 16. The third poly layer 5 is insulated from the second poly layer 6 used for the gate electrode and the second poly layer 6' used for the gate electrode line by the LTO film layer 8. Also, the N+ drain region 16' which will be described in detail is connected directly to a capacitor charge storage electrode 12A in a silicon substrate 1. Herein, the LTO film layer 8 comprises a first LTO film layer 8A, a second LTO film layer 8B, a third LTO film layer 8D which are used for an insulation, and oxide spacers 8C formed at each side of the gate electrode 6A and the gate electrode line 6B. The structure of LTO film layer 8 having the above elements will be described hereinafter.

Also, a doped oxide film 4, a metal layer 3 and a protective layer 2 are sequentially formed on the third poly layer 5 used for a bit line. The structure of the trench stacked capacitor 30 will be described in detail, and especially a process for forming the trench stacked capacitor will be described in reference with FIG. 2 to FIG. 7.

Figure 2:
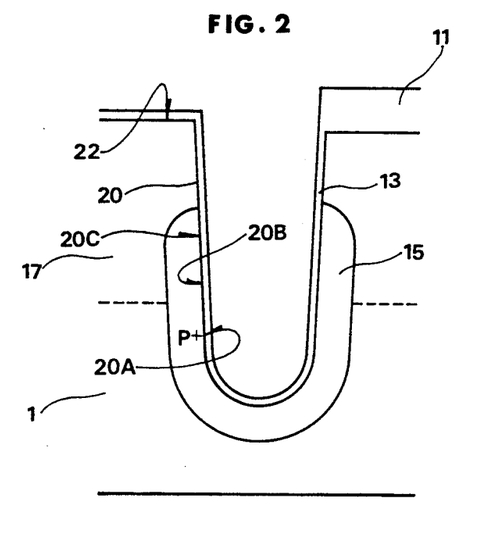
FIG. 2 illustrates a cross-section of a silicon substrate in which a trench having a P+ diffusion region formed at the outer surface of wall of trench and a capacitive oxide film layer formed at the inner surface of wall of the trench is formed.

FIG. 2 illustrates a structure in which a P well region 17 formed on a P type silicon substrate 1 by utilizing the CMOS (Complementary Metal Oxide Silicon) forming process in order to reduce the power consumption of the resulting memory device. An insulating oxide film layer 11 for element separation is formed on a portion of the P well 17 by the known LOCOS (Local Oxidation of Silicon) process. In the meantime, it can be seen that the P well region 17, on which the insulating oxide layer film 11 is formed, is more oxidized inward as shown in the drawing.

After forming a mask pattern for forming a trench by known technology even though it is not shown on the P well region 17 adjacent to the insulating oxide film layer 11, a trench is formed by the known RIE (Reactive Ion Etching) etching from the top 22 of the P well region 17 into the P type silicon substrate 1 in accordance with the mask pattern. A P+ diffusion region 15 is formed on an outer surface 20B of wall 20C of the trench 20 by a selective doping utilizing the known photoresist etch back technology. Even though the process for selectively forming the P+ diffusion region 15 on the outer surface 20B of wall 20C of the trench 20 using the photoresist etch back technology is not shown in the drawings, the method forming the P+ diffusion region 15 will be described briefly. After a dopant source, such as BSG (Boro-Silica-Glass) and PSG (Phosphorus-Silica-Glass), is deposited on the inner surface 20A of the wall 20C of the trench 20 to the desired thickness, the trench 20 is filled with a photoresist and planarized. As will be described below, after removing the photoresist and BSG layer down to the etch back end point, all the remaining photoresist is removed from the trench 20. By the heat treatment on the dopant source, such as BSG, which remains on the inner surface 20A of wall 20C of the trench 20, the P+ diffusion region 15 is formed. Then, the remaining dopant source is removed and a capacitive oxide film layer 13 is deposited on the inner surface 20A of wall 20C of the trench 20 and the P well region 17.

Figure 3:
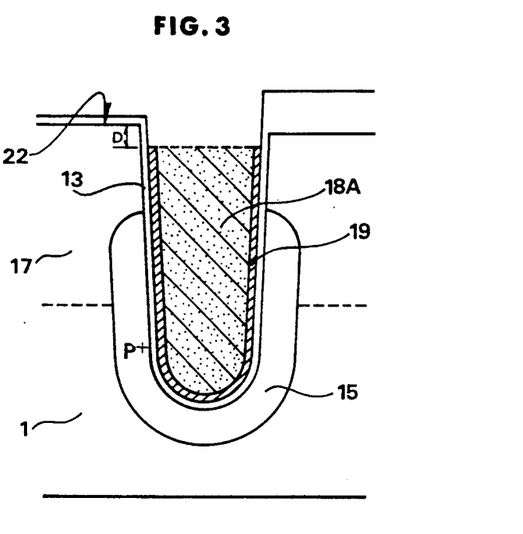
FIG. 3 illustrates a cross-section of the trench in which a polysilicon layer is deposited on the oxide film layer, and a photoresist layer is deposited.

FIG. 3 illustrates a structure in which a N type polysilicon layer 19 is deposited on the capacitive oxide film layer 13 to desired thickness and the trench 20 is filled with a first photoresist 18A. After this, the etch back process is performed to remove the first photoresist 18A from the top 22 of the P well region 17 to the point D shown in FIG. 3. At the same time, a portion of the N type polysilicon layer 19 is removed to the same depth, i.e. to the point "D".

Figure 4:
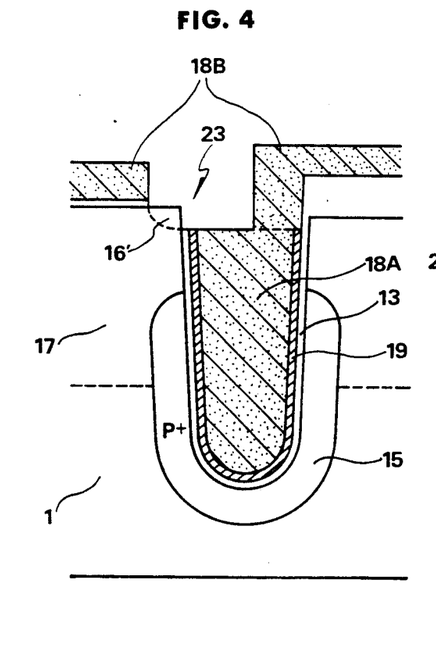
FIG. 4 illustrates a cross-section of the trench in which a photoresist layer is deposited again after the structure shown in FIG. 3 is formed, and then a portion of the oxide film layer is removed concurrently with removing a portion of the photoresist layer.

FIG. 4 illustrates a structure in which a second photoresist 18B fills the structure shown in FIG. 3 in order to form a N+ drain region 16' of the MOSFET 21 shown in FIG. 1. Then, a photoresist mask pattern 23 is formed by removing a portion of the second photoresist 18B, with the known photoresist etch back technology, where the N+ drain region 16' is to be formed. A portion of the capacitive oxide film layer 13 exposed by the etch back process is removed after the second photoresist 18B is removed as mentioned above.

Figure 5:
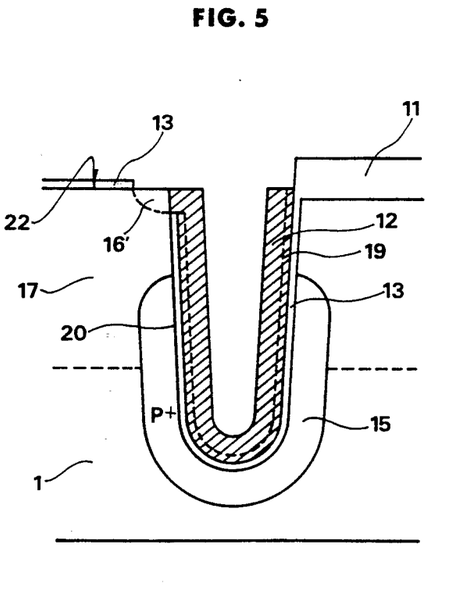
FIG. 5 illustrates a cross-section of the trench in which a poly 1 layer is formed inside the trench to a desired thickness after the photoresist layer is removed.

FIG. 5 illustrates a structure in which the first photoresist 18A and the second photoresist 18B are entirely removed after the process described in conjunction with FIG. 4. Also, after a N type poly layer 12 doped with a N type impurity, such as, is deposited to the desired thickness on the N type polysilicon layer 19, the P will region 17 and the insulating oxide film layer 11, the N+ drain region 16' is formed in the P+ well 17 as shown in dotted line in FIG. 4 by known heat treatment. Then, by removing a portion of the N type first poly layer 12 doped with the N type impurity, such as, to the top of the trench 20, i.e. the top 22 of the P well region 17, the N+ drain region 16' is connected to the N type first poly layer 12. It should be understood that the N type polysilicon layer 19 and the N type first poly layer 12 become a charge storage electrode 12 A for the trench stacked capacitor 30.

Figure 6:
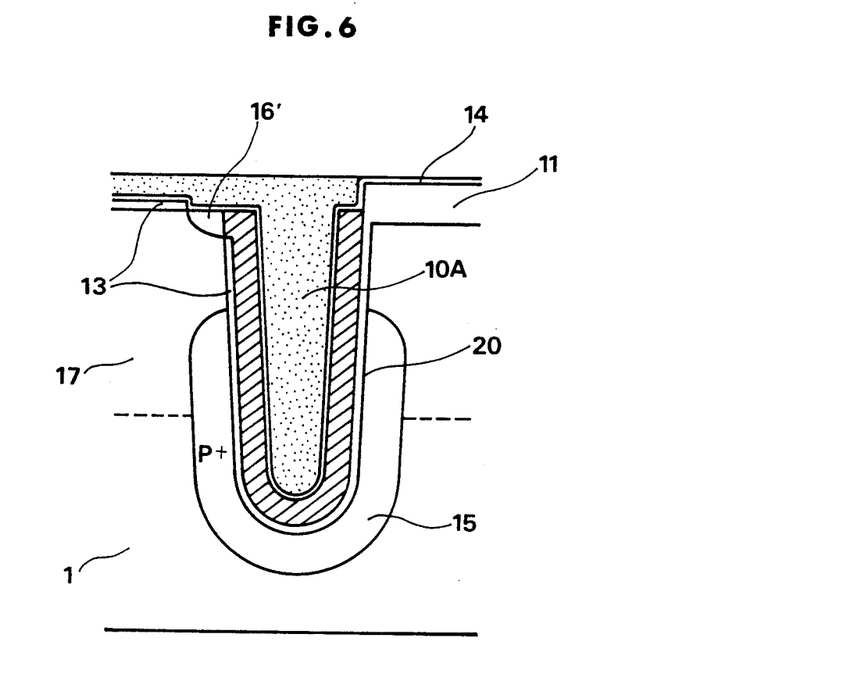
FIG. 6 illustrates a cross-section of the trench in which it is filled with a first poly material after an ONO layer formed on the entire surface of the trench including the top of the first poly layer.

FIG. 6 illustrates the structure in which after forming a ONO (Oxide-Nitride-Oxide) layer or oxide film layer 14 on the structure shown in FIG. 5, the first N type first poly material 10A for a VCC/2 electrode is deposited thereon. The N type first poly material 10A for the VCC/2 electrode is removed by the known etch back process. That portion of the N type first poly material 10A which overlays the ONO 14 except for the N type first poly material 10A with trench 20, as see FIG. 7, is removed.

Figure 7:
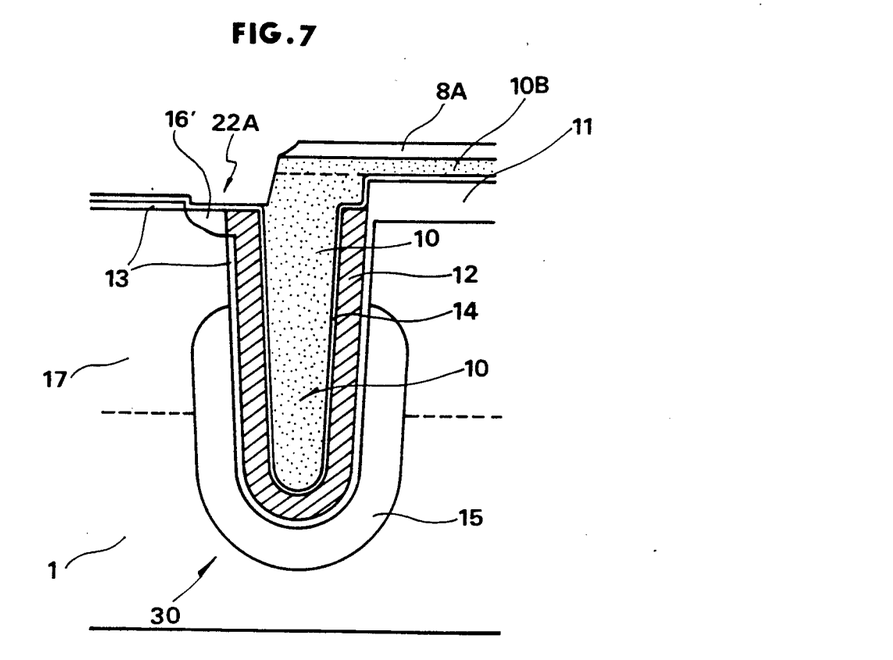
FIG. 7 illustrates a cross-section of the trench in which a LTO (Low Temperature Oxide) film layer is formed on the top of a second poly material.

FIG. 7 illustrates the structure in which a portion of the first N type poly material 10 A for the VCC/2 electrode on the ONO layer 14 adjacent to the N+ drain region 16', that is, the portion positioned opposite 22A to the insulating oxide film layer 11, has been etched away by the etch back process. A second N type second poly material 10B is deposited on the first N type first poly material 10A and on the ONO layer 14 formed on the insulating oxide film layer 11. A first LTO film layer 8A is then deposited on the resulting structure and a portion of the first LTO film layer 8A is etched away by the known etching technology, leaving the portion positioned on the N type second poly material 10B. It results in the formation of a first LTO film layer 8A only on the second N type second poly material 10B. Therefore, a VCC/2 electrode 10 is formed. Next, the capacitive oxide film layer 13 and the exposed ONO or oxide film layer 14 positioned only opposite to the insulating oxide film layer are removed, as see FIG. 1.

As described above, when a process of the present invention for manufacturing the trench stacked capacitor 30 is performed in sequence, a capacitor between the poly layer 12 and the P+ diffusion region 15 is obtained, and also another capacitor between the capacitor charge storage electrode 12A and the VCC/2 electrode 10 is obtained so that two capacitors are connected to the N+ drain region 16' in parallel. Therefore, according to the present invention the capacitance of the resulting device is greatly increased. Also, an erroneous operation of the device caused by a voltage break-down of the oxide film layers is prevented by making the thickness of the capacitive oxide film layer 13 and the ONO layer 14 thick.

A process for forming the MOSFET 21 will be described in reference with FIG. 1.

A gate oxide film layer 9 is formed on the P well region 17 adjacent to the trench stacked capacitor 30. A second poly layer 6 for a N type gate electrode is deposited on the gate oxide film layer 9. A second poly layer 6' for gate electrode line is deposited on a first LTO film layer 8A. Then, a second LTO film layer 8B is formed on the second poly layer 6 for the gate electrode and the second poly layer 6' for the gate electrode line. During an oxidation process or etching process, in order to prevent the oxide film layer from growing upward, a nitride film, not shown, is deposited on the second LTO film layer 8B. Then, the gate electrode 6A and gate electrode line 6B are formed by a gate patterning process as shown in the drawing, and the other portion of the second poly layers 6 and 6' except for the portions used for the gate electrode 6A and the gate electrode line 6B is removed. The process for forming the gate electrode 6A and the gate electrode line 6B will not be described further herein for simplicity as well as it is not shown in the drawing in order to avoid complexity.

After an oxide film layer 9 is formed on the P well region 17, thin N type LDD (Lightly Doped Drain) region 16A and 16B are formed by the ion implantation in the P well region 17 at the both sides of the gate electrode 6A. Also, in order to form spacers at the both sides of the gate electrode 6A and the gate electrode line 6B, an oxide layer is deposited. Isotropic etching is then performed, thereby spacers 8C are obtained, which protect the LDD region 16A and 16B when an IPOLY layer 7 is diffused for forming a N+ source region 16 to be formed later.

Next, the nitride film formed on the gate electrode 6A and the gate electrode line 6B is removed and an IPOLY layer 7 containing N type impurity is deposited on the entire surface of the structure to form the N+ source region without using a mask pattern process. Then, most of IPOLY layer 7 is removed remaining the portion where the N+ source region is to be formed. A N+ source region 16 is formed by diffusing the impurity contained in the IPOLY layer 7 into the P well region 17 with a heat treatment.

As result of the process described above, since there is no need to utilize the mask pattern when the N+ source region 16 is formed, it is possible to reduce a tolerance resulting from the mismatch of alignment of mask pattern which necessarily happens during the mask alignment. Next, a third LTO film layer 8D is deposited, thereby an insulation is provided between the gate electrode 6A and the gate electrode line 6B, and a third poly layer 5 for a bit line which will be formed in accordance with the following process. After a portion of the third LTO film layer 8D on the IPOLY layer 7 is removed, the third poly layer 5 is deposited, thereby the IPOLY layer 7 is connected directly to the third poly layer 5 for bit line.

As described above, after the gate electrode 6A, the LDD region 16A and 16B are formed, the N+ source region 16 is formed by the heat treatment of the N type impurity doped IPOLY layer 7 and the third poly layer 5 for bit line is formed by a self-alignment contact process. Therefore, a mask alignment process for forming the N+ source region 16 is not required, and also the contact area can be taken widely up to the top of the gate electrode 6A during depositing the poly 4 layer for bit line, resulting in reduction of the area of MOSFET.

Then, after a doped oxide film layer 4 is formed on the third poly layer 5 and a metal layer 3 for word line strapping is formed on said doped oxide film layer 4, a protective film layer 2 is deposited thereon. The structure manufactured in accordance with the process mentioned above is the DRAM cell according to the present invention, the schematic cross-section of which is illustrated in FIG. 1.

The operation of the present invention is performed in a manner that the N MOSFET 21 charges or discharges the trench stacked capacitor 30. For example, in the case that the gate electrode 6A in the N MOSFET 21 is selected through the word line in order to charge the trench stacked capacitor 30, the N+ source region 16 and the N+ drain region 16' become electrically conductive. Therefore, as the charges coming through the third poly layer 5 for bit line is stored in the trench stacked capacitor 30, this is the information storing state. Then, the gate electrode 6A is electrically disconnected so that the trench stacked capacitor 30 is maintained in charged state. Also, in order to discharge the charges in the trench stacked capacitor 30, the gate electrode is also selected with a low voltage which is lower than the voltage applied for charging the trench stacked capacitor, thereby the N+ source region 6 and the N+ drain region 6' become conductive again. That is, when a low voltage is applied to the third poly layer 5 for bit line connected to the N+ source region 16, the charge stored in the trench stacked capacitor 30 is discharged to the third poly layer 5 for bit line through the N+ source region 16 and the N+ drain 16'. Therefore, the trench stacked capacitor 30 becomes "O" states.

The present invention increases by a factor of two the capacitance of trench capacitor using the trench stacked capacitor 30, in which oxide film layers are formed in stack in the prior art SDT (Side-Wall Doped Trench) structure, in comparison with the prior art trench having one oxide film layer. Also, according to the present invention, the N+ drain region of MOSFET is connected to the capacitor charge storage electrode in the silicon substrate. Therefore, unlike the prior art structure, a contact area for connecting the N+ drain region and the capacitor charge storage electrode is not required.

Also, the distance between the third poly layer 5 for bit line and each electrode of MOSFET can be minimized by utilizing the self-aligned contact process.

As result of advantages mentioned above, in designing the cell, the length of the third poly layer 5 for the bit line in transversal direction in the cell structure using the folded bit line arrangement method can be minimized. In other words, since in the folded bit line arrangement method two MOSFET electrodes must be required, in order to reduce the size of the cell, the process pattern defining the width of the MOSFET and the distance between the MOSFETs should be designed to have a minimum size. For example, if the size of minimum process pattern is X, the total length of unit cell in transversal direction is 4X. Therefore, if the length of the unit cell in longitudinal direction (in words direction) is Y, the area A of the unit cell is as follows:

$$A = 4X \times Y \quad (1)$$

From the relation (1), if Y is designed to be a minimum process pattern size (for example, it is assumed that each length of the active area and the insulating area are designed to be X from the top view of FIG. 1 which is not shown), the resulting Y is as following:

$$Y = 2X \quad (2)$$

Consequently, according to the present invention, the minimum area A of unit cell in accordance with the folded bit line arrangement method is as follows:

$$A = 4X \times 2X = 8X^2 \quad (3)$$

It is can be seen that, for example, if the minimum process pattern size is 10 micrometers (hereinafter referred to as "$\mu m$"), it can be designed the area A to be $A = 4 \times 1 \; \mu m \times 2 \times 1 \; \mu m = 8$ sq. $\mu m$ and if the minimum process pattern size is 0.5 $\mu m$, it is designed the area A to be $A = 4 \times 0.5 \; \mu m \times 2 \times 0.5 \; \mu m = 2$ sq. $\mu m$.

While the invention has been described with respect to the preferred embodiments of the process using a N MOSFET after forming a P well region on the P type substrate, as appreciated by one skilled in the art, it should be noted that the same process can be applied such that a N well region is formed on the P type silicon substrate and a P type MOSFET is formed on the N well region and the selectively doped diffusion region is a N type and the material forming the capacitor charge storage electrode and the material forming the VCC/2 are P type poly material.

The forgoing description of the present embodiment has been presented for the purpose of illustration and description. It is not intended to limit the scope for this invention. Many modifications and variation are possible in the light of above teaching. For example, even though the process for forming the P well region on the P type silicon is illustrated in the above description, it is also possible to form a P type MOSFET on a N well formed on the P type silicon substrate. It is intended that the scope of the invention be defined by the claims.

What is claimed is:

1. A method for manufacturing a DRAM cell having a SDTAS structure:

providing a P type silicon substrate;

forming a P well region on the P type silicon substrate with the P well region having a top;

forming an insulating oxide film layer for element separation on a portion of the top of the P well region by the LOCOS process;

forming a trench extending through a portion of the insulating oxide film layer formed on the top of the P well region and into a portion of the P type silicon substrate with the trench having a wall with an inner surface and an outer surface;

forming a selectively doped P+ diffusion region extending from the outer surface of wall of the trench into a portion of the P well region and in a portion of the P type silicon substrate by the photoresist etch back process;

forming a capacitive oxide film layer on the insulating oxide film layer exposed by the formation of the trench and on the P well region and on the inner surface of the wall of the trench;

depositing a N type polysilicon layer on the capacitive oxide film layer positioned in trench and opposite to the insulating oxide film layer;

removing the N type polysilicon layer from the area opposite to the insulating oxide film layer;

removing the capacitive oxide film layer from the area opposite to the insulating oxide film layer thereby exposing the P well region thereat;

depositing a first poly layer on the N type polysilicon layer, on the P well region opposite to the insulating oxide film layer and on the capacitive oxide film layer and diffusing the impurity contained in the first poly layer into the P well region opposite to the insulating oxide film layer by heat treatment to form a N+ drain region;

forming in the trench, a trench stacked capacitor which comprises a capacitor charge storage electrode which is in physical contact and is electrically connected to the N+ drain region, and a VCC/2 electrode which is electrically isolated by an ONO layer formed between the capacitor charge storage electrode and the VCC/2 electrode;

depositing a first LTO oxide film layer on the VCC/2 electrode;

removing the ONO layer formed on the capacitive oxide film layer, on the drain region and on the top 22A of capacitor charge storage electrode;

removing the capacitive oxide film layer formed on the top of P well region opposite to the insulating oxide film layer;

forming a gate electrode formed on the P well region opposite to the insulating oxide film layer with a second LTO, film layer being formed on the gate electrode;

forming a gate electrode line formed on the LTO film layer on the trench with the second LTD film layer being formed on the gate electrode;

forming LDD regions in the P well region adjacent to each side of the gate electrode by ion implantation;

forming oxide spacers at each side of the gate electrode and the gate electrode line;

forming an IPOLY layer on a N+ source region to be formed later and on a portion of the gate electrode on which the second LTO film layer is formed;

forming the N+ source region by diffusing an impurity contained in the IPOLY layer into the P well region by the heat treatment;

removing a portion of a third LTO film layer formed on the IPOLY on the N+ source region after the third LTO film layer is formed on the entire surface;

depositing a third poly layer for a bit line on the third LTO film layer and the IPOLY layer where a portion of the third LTO film layer is removed, thereby the N+ source region for bit line is connected to the third poly layer;

forming a doped oxide film layer on the third poly layer;

forming a metal layer on the doped oxide film layer; and forming a protective layer on the doped layer and the metal layer.

2. The method for manufacturing a DRAM cell having a SDTAS structure of claim 1 which comprises forming the P+ diffusion region by the photoresist etch back process comprising the steps of:

depositing a impurity dopant source on the inner surface of wall of said trench wall;

filling the trench with a photoresist, and selectively etching back the photoresist to the desired etch back end point;

removing the portion of the impurity dopant exposed by the selective etching of the photoresist;

removing all the remaining photoresist;

forming the selective P+ region on the outer surface of wall of the trench by the heat treatment of remaining impurity dopant source; and removing the remaining impurity dopant source from the trench.

3. The method for manufacturing a DRAM cell having a SDTAS of claim 1 which comprises forming the N+ drain region comprising the steps of:

depositing a N type polysilicon layer on the capacitive oxide film layer;

filling the trench having the polysilicon thereon with the first photoresist, and removing the first photoresist to the depth, "D" from the top of the P well region, thereby removing the exposed portion of said polysilicon;

depositing a second photoresist to the first photoresist in the trench and concurrently depositing the second photoresist on the insulating oxide film layer and the capacitive oxide film layer formed on the P well;

forming a mask pattern by etching a portion of the second photoresist in order to expose the capacitive oxide film layer;

removing the exposed capacitive oxide film layer, and removing any remaining first and second photoresist;

forming the N type first poly layer on said polysilicon layer, on the P well region where a portion of the capacitive oxide film layer is removed, and on the capacitive oxide film layer formed on the P well region; and diffusing the impurity contained in the N type first poly layer by heat treatment to form the N+ drain region in the P well region where the portion of the capacitive oxide film layer is removed.

4. The method of claim 1 wherein the trench stacked capacitor is formed by maintaining the first poly layer deposited in the trench while removing any other first poly layer deposited, thereby forming a capacitor charge storage electrode which is in physical contact and is electrically connected to the N+ drain region;

forming an ONO layer on the insulating oxide film layer, on the first poly layer, on the capacitive oxide film layer and on the P well region;

depositing a first N type poly material on the ONO layer formed on the P well region, and the N+ drain region while simultaneously filling the trench with a first N type poly material;

etching back the first N+ type poly material in order to expose the ONO layer formed on the N+ drain region, the top of the N type first poly layer and on the P well region opposite to the insulating oxide film layer, and depositing a second poly material on the first poly layer which fills the trench, and on the ONO layer formed on the insulating oxide film layer, thereby forming the VCC/2 electrode.

5. The method for manufacturing a DRAM cell having a SDTAS of claim 1 wherein forming the N+ source region and forming the third poly layer for the bit line connected to the N+ source region through the IPOLY layer are performed by self-aligned contact process.

6. A method for manufacturing a DRAM cell having a SDTAS structure:

providing a P type silicon substrate 1;

forming a P well region 17 on the P type silicon substrate 1 with the P well region having a top 22;

forming an insulating oxide film layer 11 on a portion of the top 22 of the P well region for element separation on a portion of the top of the P well region by the LOCOS process;

forming a trench 20 extending through a portion of the insulating oxide film layer formed on the top 22 of the P well region 17, through the P well region and into a portion of the P type silicon substrate 1 with the trench 20 having a wall 20C with an inner surface 20A and an outer surface 20B; forming a selectively doped P+ diffusion region extending from the outer surface of wall of the trench into a portion of the P well region and in a portion of the P type silicon substrate by the photoresist etch back process;

forming a capacitive oxide film layer 13 on an edge portion of the insulating oxide film layer 11 exposed by the formation of the trench 20 and on the P well region, and on the inner surface of the wall of the trench;

depositing a N type polysilicon layer 19 on the capacitive oxide film layer 13;

depositing a layer of first photoresist 18A over the N type polysilicon layer 19, thereby filling trench 20;

removing first photoresist 18A and N type polysilicon layer 19 from capacitive oxide film layer 13 to a point "D" located in trench 20, thereby maintaining a portion of N type polysilicon layer 19 and the first photoresist 18A in trench 20;

depositing a second photoresist 18B over capacitive oxide film layer 13, insulating oxide film layer 11 and trench 20;

etching a portion of second photoresist 18B thereby forming a mask pattern to enable the etching of the capacitive oxide film layer 13 which underlies second photoresist 18B to expose a P well region opposite to the insulating oxide film layer;

removing the first photoresist 18A and the second photoresist 18B;

depositing a first poly layer 12 on the surface of the insulating oxide film layer, 11; capacitive oxide film layer 13; and the P well region;

forming a N+ drain region opposite to the insulating oxide film layer by diffusing an impurity contained in a first poly layer 12 into the P well region by heat treatment;

maintaining the first poly layer 12 deposited in the trench while removing any other first poly layer 12 deposited thereby forming a capacitor charge storage electrode 12A;

forming an ONO (or oxide film) layer 14 on the insulating oxide film layer 11, the first poly layer 12, the capacitive oxide film layer 13 and the P well region 17;

depositing a first N type poly material 10A on the ONO (or oxide film) layer 14 layer formed on the P well region, and the N+ drain region while simultaneously filling the trench with a first N type poly material 10A;

etching back the first N+ type poly material 10A in order to expose the ONO (or oxide film) layer 14 formed on the N+ drain region, the top 22A of the N type first poly layer 12 and on the P well region opposite 22B to the insulating oxide film layer 11, depositing a second poly material 10B on the first poly layer 12 which fills the trench, and on the ONO (or oxide film) layer 14 formed on the insulating oxide film layer 11, thereby forming the VCC/2 electrode;

depositing a first LTO oxide film layer on the VCC/2 electrode;

removing the ONO (or oxide film) layer 14 formed on the capacitive oxide film layer 13, on the drain region and on the top 22A of capacitor charge storage electrode 12A;

removing the capacitive oxide film layer 13 formed on the top of P well region opposite 22B to the insulating oxide film layer;

forming a gate electrode formed on the P well region opposite to the insulating oxide film layer with a second LTD film layer being formed on the gate electrode;

forming a gate electrode line formed on the LTO film layer on the trench with the second LTO film layer being formed on the gate electrode;

forming LDD regions in the P well region adjacent to each side of the gate electrode by ion implantation;

forming oxide spacers at each side of the gate electrode and the gate electrode line;

forming an IPOLY layer on a N+ source region to be formed later and a portion of the gate electrode on which the second LTO film layer is formed;

forming the N+ source region by diffusing an impurity contained in the IPOLY layer into the P well region by the heat treatment;

removing a portion of a third LTO film layer formed on the IPOLY on the N+ source region after the third LTO film layer is formed on the entire surface;

depositing a third poly layer 5 for a bit line on the third LTO film layer and the IPOLY layer where a portion of the third LTO film layer is removed, thereby the N+ source region for bit line is connected to the third poly layer 5;

forming a doped oxide film layer on the third poly layer 5;

forming a metal layer on the doped oxide film layer; and forming a protective layer on the doped layer and the metal layer.

* * * * *